United States Patent [19]

Casper et al.

[11] Patent Number: 5,274,276
[45] Date of Patent: Dec. 28, 1993

[54] OUTPUT DRIVER CIRCUIT COMPRISING A PROGRAMMABLE CIRCUIT FOR DETERMINING THE POTENTIAL AT THE OUTPUT NODE AND THE METHOD OF IMPLEMENTING THE CIRCUIT

[75] Inventors: Stephen L. Casper; Stephen R. Porter, both of Boise, Id.

[73] Assignee: Micron Technology, Inc., Boise, Id.

[21] Appl. No.: 904,814

[22] Filed: Jun. 26, 1992

[51] Int. Cl.$^5$ .............................................. H03K 17/08
[52] U.S. Cl. ................... 307/443; 307/296.8; 307/451; 307/475
[58] Field of Search ............ 307/443, 448, 451, 452, 307/465, 475, 296.2, 296.8

[56] References Cited

U.S. PATENT DOCUMENTS

| | | | |
|---|---|---|---|
| 4,048,518 | 9/1977 | Koo | 307/448 |
| 4,275,313 | 6/1981 | Boll et al. | 307/448 |
| 4,463,273 | 7/1984 | Dingwall | 307/443 X |
| 4,473,762 | 9/1984 | Iwahashi et al. | 307/443 X |
| 4,503,341 | 3/1985 | Shah | 307/448 X |
| 4,527,077 | 7/1985 | Higuchi et al. | 307/443 |
| 4,585,955 | 4/1986 | Uchida | 307/296.8 |
| 4,689,505 | 8/1987 | Ghoshal | 307/578 |
| 4,692,638 | 9/1987 | Stiegler | 307/578 |
| 4,740,713 | 4/1988 | Sakurai et al. | 307/443 |
| 4,772,812 | 9/1988 | Desmarais | 307/482 |
| 4,806,798 | 2/1989 | Kanauchi | 307/482 |
| 4,894,559 | 1/1990 | Kaneko | 307/578 |
| 4,983,860 | 1/1991 | Yim et al. | 307/481 |

*Primary Examiner*—David R. Hudspeth
*Attorney, Agent, or Firm*—Susan B. Collier

[57] ABSTRACT

The invention is an output driver circuit of a dynamic random access memory (DRAM) wherein the output driver is wired in a push-pull configuration. The push-pull configuration comprises a pull-up portion and a pull-down portion serially connected at an output node. The pull-up portion comprises a an n-channel metal oxide semiconductor (NMOS) transistor having a gate potential determined by a programmable circuit. In the preferred embodiment the programmable circuit provides a potential to the gate node of the NMOS that is directly proportional to the supply potential until a maximum programmed gate potential is reached. The programmable circuit maintains the maximum programmed gate potential for further increases in the supply potential. The pull-down portion comprises a pull-down NMOS transistor interposed between the output node and ground. The pull-down NMOS transistor is controlled by a pull-down signal on the gate node. When actuated the pull-down transistor provides a low logic level at the output node. The invention is also the method of driving a potential to the output node.

24 Claims, 8 Drawing Sheets

OUTPUT DRIVER CIRCUIT COMPRISING A PROGRAMMABLE CIRCUIT FOR DETERMINING THE POTENTIAL AT THE OUTPUT NODE AND THE METHOD OF IMPLEMENTING THE CIRCUIT

FIELD OF THE INVENTION

This invention relates to electronic circuits used to provide signal outputs at desired potentials. These circuits are of interest on semiconductor integrated circuits. More particularly, the invention relates to the output driver circuit of a dynamic random access memory (DRAM) device.

BACKGROUND OF THE INVENTION

Memory Storage

A memory device stores digital data in an array of memory cells. Each memory cell has a specific address which is essentially the intersection formed by a wordline and a digit line. Once an individual cell has been selected, its true data is amplified and latched onto its digit line by a sense amp. The same sense amp also amplifies and latches the cell's complementary data onto another digit line. Thus, one digit line has a high logic level, usually approaching the supply potential, $V_{CC}$, and the other digit line has a low logic level, usually approaching 0 volts.

The Output Driver

It is necessary to transfer the data from each digit line to the output. This data transfer is accomplished by incorporating an output driver circuit into the dynamic random access memory (DRAM). The output driver circuit 5, shown in FIG. 1, typically is a push-pull circuit arrangement comprising a pull-up portion 10 serially connected to a pull-down portion 15. The push-pull arrangement is conducive to low distortion, large load power and high efficiency. In operation the output driver circuit 5 is electrically interposed between the selected memory cell (not shown) and an external circuit 20 for receiving the data from the memory cell. The output driver circuit 5 is characterized as having a high input impedance and a low output impedance in order to drive the data with minimal loss to an external circuit 20.

1. A High Output

To drive a high logic level to the external circuit 20 the pull-up portion 10 of the circuit is activated and the pull-down portion 15 is deactivated thereby driving the output node 30 toward the high logic level at $V_{CC}$ while interrupting the current through the pull-down portion 15. The output driver circuit 5 then conducts current through the pull-up portion 10 between $V_{CC}$, at the supply node 31, and a reference potential in the external circuit 20.

2. A Low Output

Conversely when the data has a low logic level the pull-down portion 15 is activated and the pull-up portion 10 is deactivated. There is minimum potential loss across the pull-down portion 15 and the ground potential, $V_{SS}$, at the reference node 32 is driven to the output node 30 through the pull-down portion 15. The current in the pull-up portion 10 is interrupted. In this case when the output driver is connected to the external circuit 20 the output driver conducts current between the ground potential at the reference node 32 and a supply potential connected to the external circuit 20. When neither the pull-up portion 10 nor the pull-down portion 15 is activated a high impedance is present at the output node 30.

3. The Pull-Up Portion

Many configurations of pull-up portions have been implemented for output driver circuitries. FIGS. 2A, 2B, 2C, and 2D are representative of a few of these pull-up circuits. In each of these examples the pull-down portion comprises an n-channel metal oxide semiconductor (NMOS) transistor.

A. The PMOS Transistor

In FIG. 2A the pull-up portion comprises a p-channel metal oxide semiconductor (PMOS) transistor 33. However utilizing the PMOS transistor as the pull-up portion has a significant limitation.

Problem

The circuit conducts a reverse leakage current if the potential at its drain exceeds the potential at its gate by more than the transistor threshold voltage ($V_T$). The output driver is often connected to an external circuit that is capable of generating a potential large enough to induce the reverse leakage current. Thus, significant reverse leakage current through the pull-up transistor may occur whenever excess potential from an external circuit is imposed upon the output node 34, regardless of whether the pull-up circuit is intentionally actuated.

B. The NMOS Transistor

In FIG. 2B the pull-up portion comprises an NMOS transistor 35, and in FIG. 2C the pull-up portion comprises two serially connected NMOS transistors 40 and 45. An advantage of this design is that the n-channel pull-up transistors effectively prevent any reverse leakage current from the output node 34. Thus, raising the potential at the output node does not forward bias the pull-up portion.

Problems

However, while the circuits of FIGS. 2B and 2C reduce or eliminate reverse current leakage, they create other problems which are detrimental to the efficiency of many integrated circuits. The problems are created by the turn-on threshold voltage of the NMOS pull-up transistor. For the pull-up transistor to conduct current it must maintain a potential equal to or greater than the $V_T$ between its gate and its source. If the $V_{CC}$ approaches a minimum high logic level the final output potential may be an invalid high logic level. Also as the potential at the gate approaches $V_{CC}-V_T$, the pull-up transistors 35 or 45 begin to turn off. When the potential at the gate reaches $V_{CC}-V_T$ the pull-up transistor is completely off.

There are other problems encountered in either NMOS pull-up arrangement. First it is necessary to use large pull-up transistors for a total size in the range of 4500 microns. These large transistors require more space. Further, the use of NMOS transistors makes the circuit subject to negative input injection wherein the NMOS transistor can be actuated by negative potential on the output node.

C. The CMOS Transistor

One solution to some of the problems inherent in the circuits of FIGS. 2A–2C has been a circuit, shown in FIG. 2D, wherein the pull-up portion of the push-pull arrangement is implemented with a complementary metal oxide semiconductor (CMOS) transistor configuration comprising serially connected PMOS and NMOS transistors. The gates of the CMOS transistors receive inverted signals ensuring that both complementary transistors have the same on-off state. The CMOS design utilizes smaller transistors effecting a considerable die space savings over conventional NMOS push-pull arrangements. This design also helps to minimize negative input injection and reverse leakage current.

4. The Pull-Down NMOS

Although other pull-down circuits may be used the pull-down portion typically employed in FIGS. 2A, 2B, 2C, and 2D is an NMOS transistor 55 interposed between the output node 34 and the reference node 65. A high potential at the gate actuates the NMOS transistor 55 and couples the low logic level of the reference potential to the output node 34 through the NMOS transistor 55 when the current is interrupted in the pull-up portion.

SUMMARY OF THE INVENTION

Problem

External circuits have minimum and maximum parameters for defining both high and low logic levels. Potentials lying within the range of potentials set by these parameters are seen as either high or low logic levels depending on which logic level is being defined by the parameters. For the circuit of FIG. 2D the potential to which the output driver can drive the output node is limited by the threshold voltage of the pull-up transistor. This limitation consequence is particularly undesirable when an integrated circuit is required to operate with a very low supply potential. For instance, it is desirable in some cases to operate an integrated circuit at a circuit supply potential as low as 3.0 volts. However, a high logic output signal at the output node is often specified to be no less than 2.4 volts. Achieving 2.4 volts at the output node with a circuit supply potential of 3.0 volts is either impossible or only marginally possible with standard n-channel transistors having threshold voltages of between 0.5 volts and 1.0 volts.

Conversely, in a case wherein the supply potential increases such that the potential at the output node would be higher than a maximum output parameter there exists a need to limit the potential at the output node.

Consequently there remains a need for an output driver circuit which provides the reverse output leakage prevention of an n-channel pull-up device while limiting the potential at the output node.

Solution

The invention is an output driver circuit for a dynamic random access memory (DRAM) device capable of driving a desired signal level to the output node. More particularly the circuit is capable of driving valid high logic levels to an output node for changes in the supply potential. The output driver circuit of the invention comprises a push-pull configuration wherein the pull-up portion comprises an NMOS transistor and comprises a programmable circuit in electrical communication with the gate of the NMOS transistor.

The programmable circuit typically provides a varying potential at the gate of the NMOS transistor in order to actuate the NMOS transistor. The programmable circuit provides a potential at the gate that varies with changes in the supply potential until a maximum value is reached. The programmable circuit then maintains the potential of the gate of the NMOS transistor at the maximum value for further changes in the supply potential.

DETAILED DESCRIPTION OF THE PREFERRED EMBODIMENT

Definitions

The barrier potential is the difference in potential across the depletion layer of a diode that must be overcome in order for the diode to conduct current.

Latch-up occurs when a node is inadvertently latched to a potential of another node. Latch-up of the output node to the potential of the supply node occurs in the output driver circuit when the potential at the drain of the p-channel metal oxide semiconductor (PMOS) transistor is great enough to forward bias the active area of the PMOS transistor. Reverse output leakage current is the current that flows in the output driver circuit due to the biasing of the PMOS transistor by a potential on the output node that is higher than a potential on the supply node. Under these conditions the diode formed by the n and p regions of the PMOS is biased when the potential difference between a potential of the external circuit and the potential of the supply node is equal to or greater than the barrier potential of the diode thus formed.

The threshold voltage ($V_T$) is the voltage that must be maintained between the gate and source of a metal oxide semiconductor (MOS) transistor in order for the transistor to conduct current. Thus, the potential of the output node of the preferred embodiment is a $V_T$ less than the potential at the gate node.

Object

It is desirable to provide an output signal that retains a valid high logic level for variable values of $V_{CC}$.

Features

Figure 1:
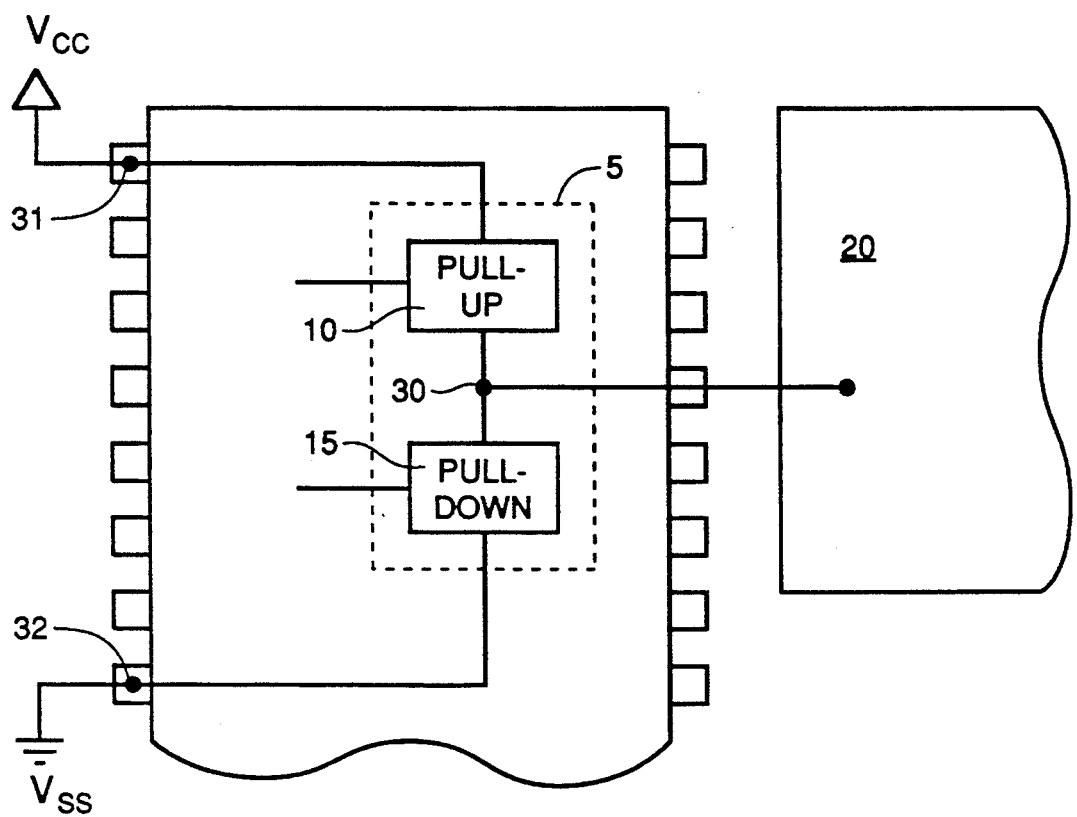
FIG. 1 is a block schematic of an output driver circuit wired in a push-pull configuration.
Figure 2B:
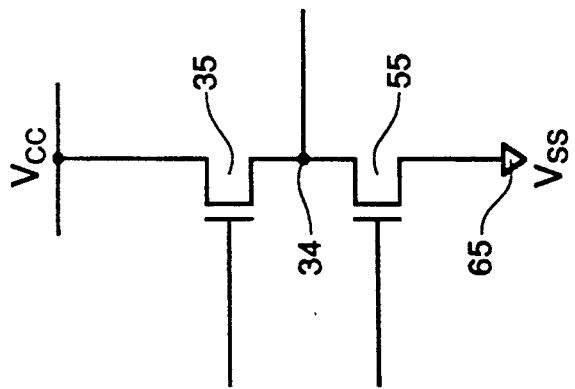
FIGS. 2A, 2B, 2C and 2D are schematics depicting various output driver circuits of the related art.
Figure 2A:
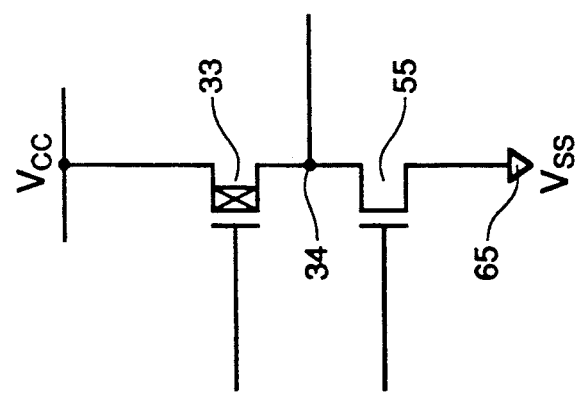
Figure 2D:
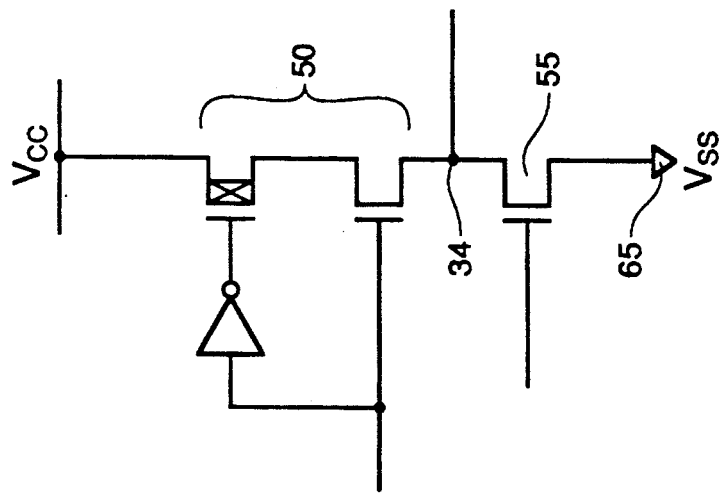
Figure 2C:
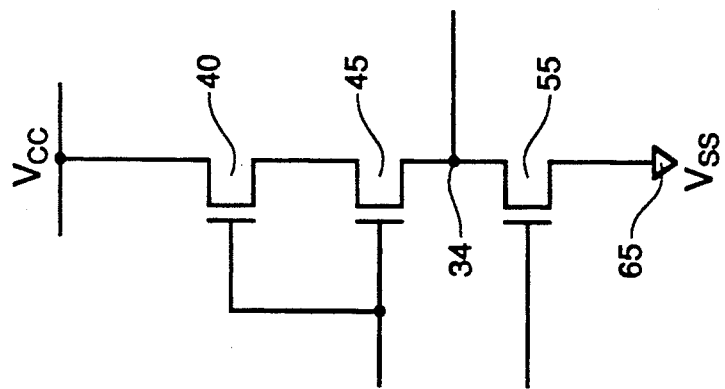
Figure 3:
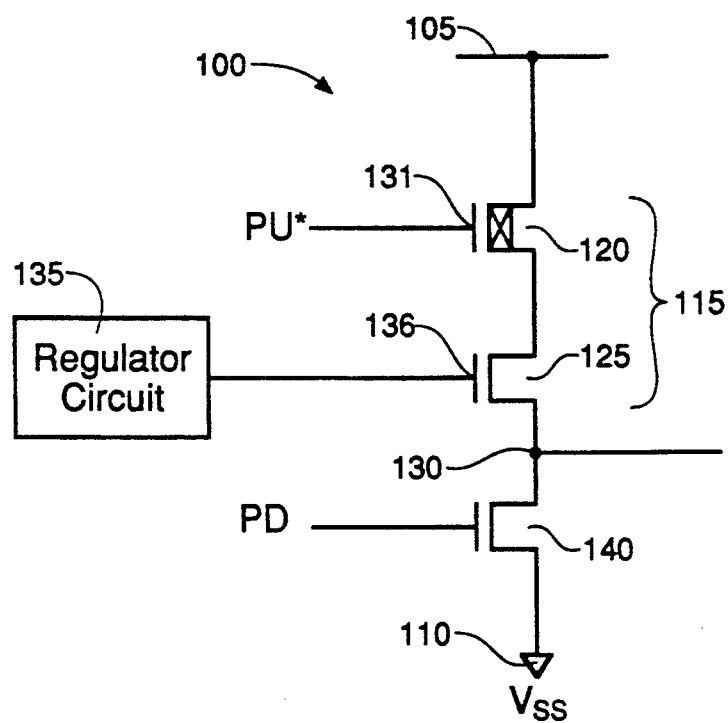
FIG. 3 is a schematic of the push-pull configuration and the regulator circuit of the output driver circuit of the preferred embodiment.

FIG. 3 is a schematic of the preferred embodiment of the invention. The preferred embodiment is an output driver circuit 100 comprising a push-pull transistor configuration interposed between a supply node 105 and a reference node 110. The supply node 105 and the reference node 110 are connectable to a supply potential and a reference potential respectively. The supply potential is typically 3 to 5 volts and the reference potential is typically a ground potential of 0 volts. The push-pull configuration comprises a pull-up portion for driving the potential of the output node toward a high logic level and comprising a pull-down portion for driving the potential of the output node toward a low logic level.

1. The Pull-Up Portion

Complementary metal oxide transistor (CMOS) configuration 115 comprising a PMOS transistor 120 and an n-channel metal oxide semiconductor (NMOS) transistor 125 comprises the pull-up portion of the preferred embodiment. The PMOS transistor 120 is connected to the supply node 105 and serially connected to the NMOS transistor 125 which in turn is connected to the output node 130. The PMOS transistor 120 and the NMOS transistor 125 are gated by complementary signals. When the CMOS transistors 115 are actuated the potential of the output node is driven to a high logic level and when the CMOS transistors 115 are deactuated there is no current conduction between the output node 130 and the supply node 105. In the preferred embodiment the PMOS transistor 120 is actuated by the complement of the pull-up control signal (PU*) at gate 131. PU* is typically the complement of the data to be driven to the output node 130. Therefore when a low potential gates the PMOS transistor 120 in conjunction with the actuation of the NMOS transistor 125 the potential of the output node 130 is driven to a potential having a high logic level.

2. The Regulator Circuit

In the preferred embodiments a regulator circuit 135 provides a potential at the gate node 136 of the NMOS transistor 125. The potential provided by the regulator circuit 135 actuates the NMOS transistor 125. In a first embodiment the regulator circuit 135 is a potential generator providing a pumped potential. If the pumped potential is greater than the supply potential and remains a threshold above the supply potential the output node 130 remains at the supply potential. If the pumped potential is less than the supply potential the output node 130 is driven to a potential having a value equal to a threshold below the pumped potential. Typical supply potentials are 5 volts and 3.0 volts, although it is conceivable that other values, even supply potentials larger than 5 volts, may be used.

In a second embodiment the regulator circuit 130 is a programmable circuit that provides a potential to the gate of the NMOS transistor 125 that is directly proportional to the potential of the supply potential until a programmed gate potential is reached. When the programmed gate potential is reached the regulator circuit 135 starts to clamp the potential of the output node 130 to a maximum potential.

3. The Pull-Down Portion

The pull-down portion of the output driver circuit comprises an NMOS transistor 140 interposed between the output node 130 and the reference node 110. The NMOS transistor 140 is actuated by the pull-down control signal (PD) at its gate. When PD has a high logic level (the active state) the potential of the output node 130 is driven toward the reference potential through the actuated NMOS transistor 140. At the same time a high logic level on the gate of the PMOS transistor 120 deactuates the PMOS transistor 120 thereby interrupting the current path between the output node 130 and the supply node 105. Conversely when a low logic level activates the PMOS transistor 120 a low logic level on the control signal PD deactuates NMOS transistor 140 thereby interrupting current flow between the reference node 110 and the output node 130.

Many variations of pull-down portions are known and other implementations may be used without departing from the spirit and scope of the invention. One variation being the pull-down portion of the push-pull circuit described in allowed patent application entitled CMOS BOOTSTRAPPED OUTPUT DRIVER METHOD AND CIRCUIT, Ser. No. 07/619,164, which is herein incorporated by reference.

In the case where both the pull-up portion and the pull-down portion are deactuated the output node sees a high impedance.

Advantages

The regulator circuit of the first and second embodiments ensures that the output driver circuit provides output signals having valid high logic levels regardless of the value of the supply potential. This integrity of the high logic level is accomplished while retaining the comparatively quick response of a p-channel pull-up device (the PMOS transistor 120) while also providing the reverse output leakage prevention of an n-channel pull-up device (NMOS transistor 125). The regulator circuit of the preferred embodiments also has the capability of reducing noise when the output driver is connected to relatively high supply potentials.

The Potential Generator

When the regulator circuit 135 is a potential generator used to provide the desired potential at the gate 136 the actual circuit implementation can vary. The exact circuit implementation depends on the desired output potential for a given supply potential. The potential generator is typically designed to provide a potential that effects minimal potential loss across the NMOS transistor 125. Therefore the gate 136 of the NMOS transistor 125 is biased at a pumped potential which is greater than or equal to the sum of the supply potential and the minimal threshold voltage required to actuate the NMOS transistor 125, and biased at a pumped potential that is less than or equal to the sum of the supply potential, the minimal threshold voltage required to actuate the NMOS transistor 125, and the barrier potential of the diode created between the p+ region and the n— well of the PMOS transistor 120. This parameter provides a pumped potential at gate 136 that assures that the PMOS transistor 120 won't go into latch-up, and it also ensures a minimal potential loss across the NMOS transistor 125.

Figure 4:
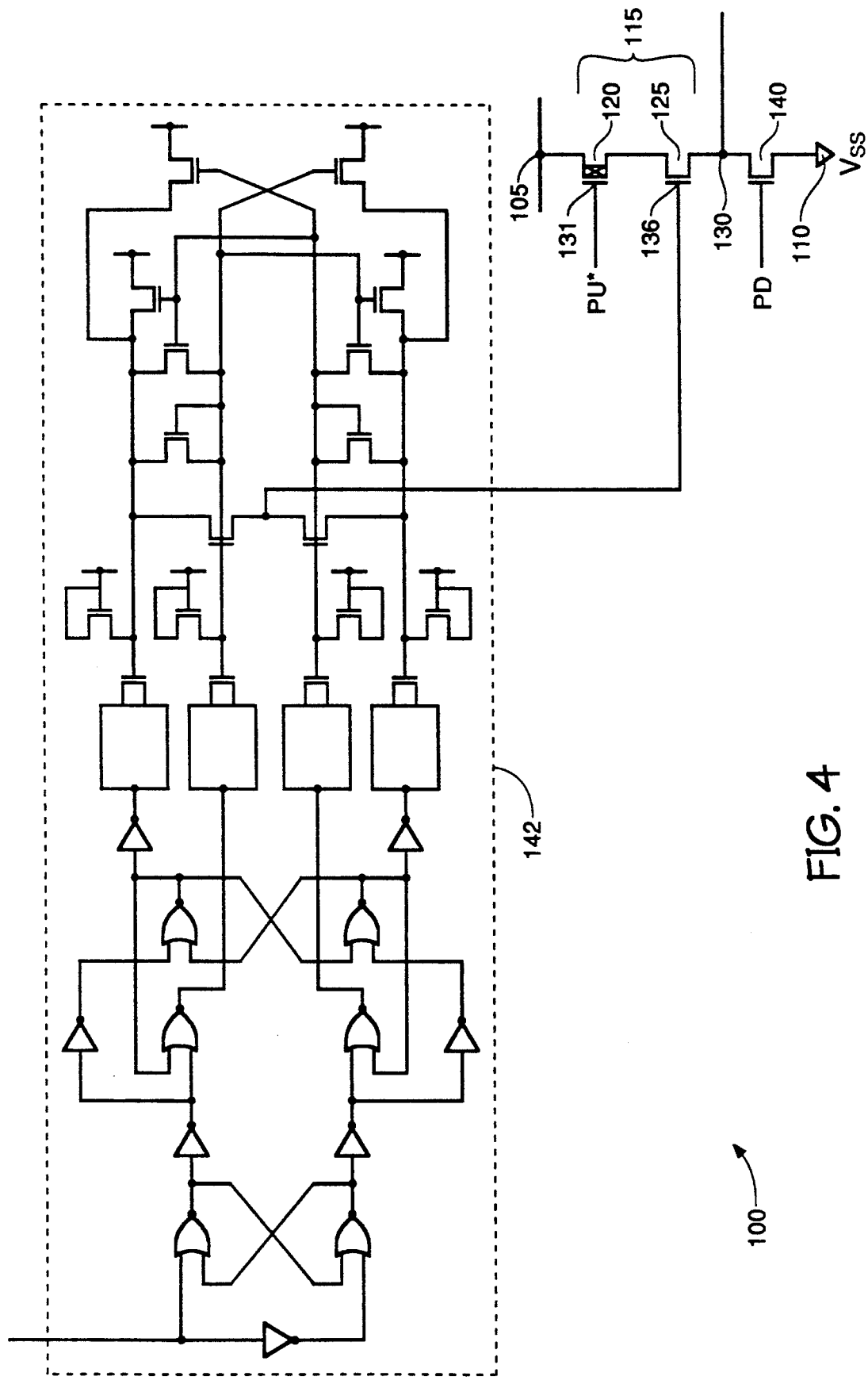
FIG. 4 is a more detailed schematic of the regulator circuit of FIG. 3 when the regulator circuit provides a pumped potential.

The pumped potential may either be an uninterrupted potential on gate node 136 or may be a potential clocked to gate node 136 to coincide with the active state of the input signal PU*. The designer may also take into account other design considerations such as power consumption and die space required. Potential generators are well known in the art and the actual circuit implementation is not critical. The simplified pump generator 142 shown in FIG. 4 is just one example of a pumped generator that may be used.

Therefore the potential generator provides a valid high logic level at the output node even for supply potentials having unusually low values thereby enhancing the reliability of the DRAM device.

The Programmable Circuit

Figure 5:
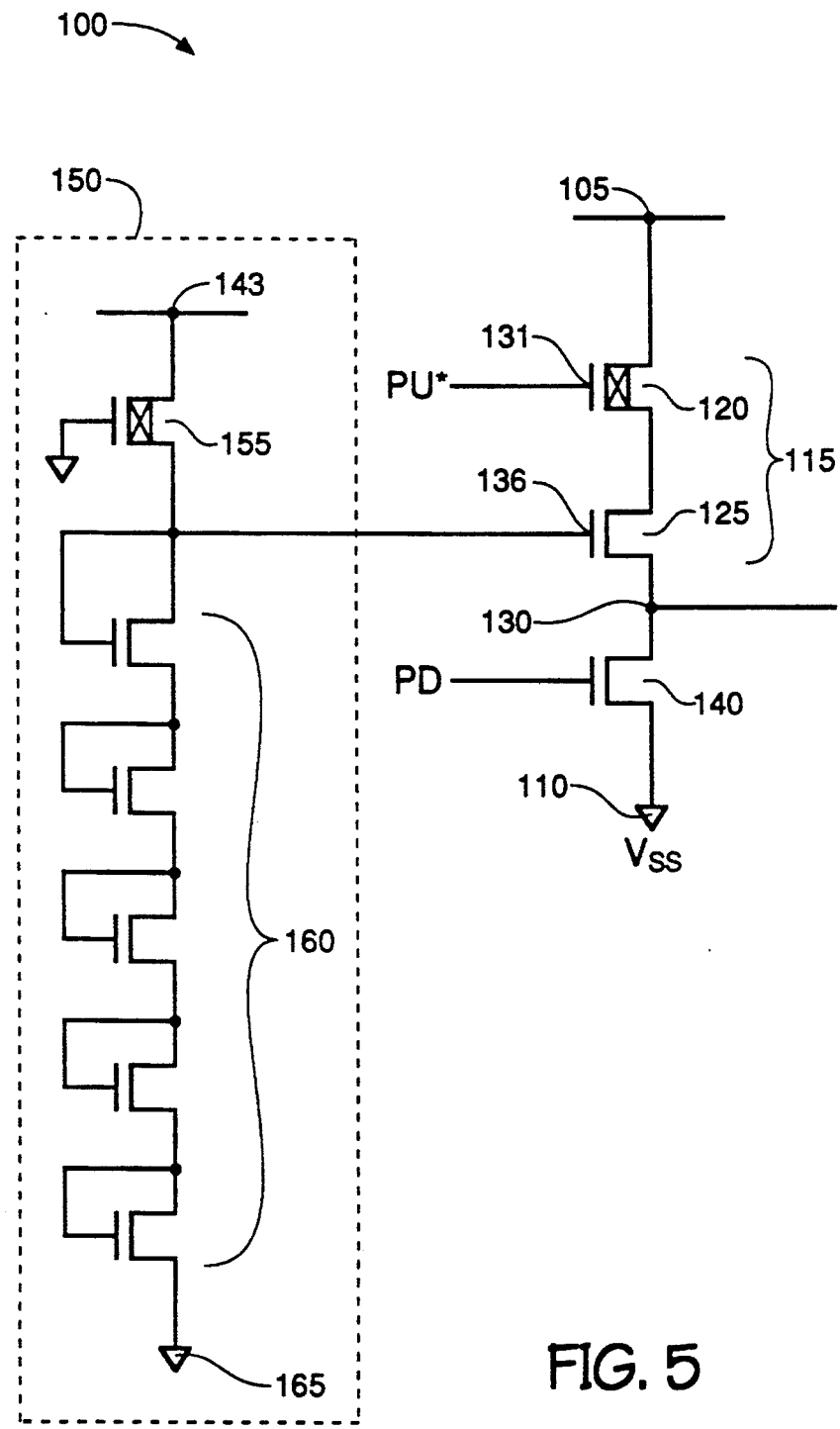
FIG. 5 is a more detailed schematic of the regulator circuit of FIG. 3 when the regulator circuit provides a programmable output.
Figure 6:
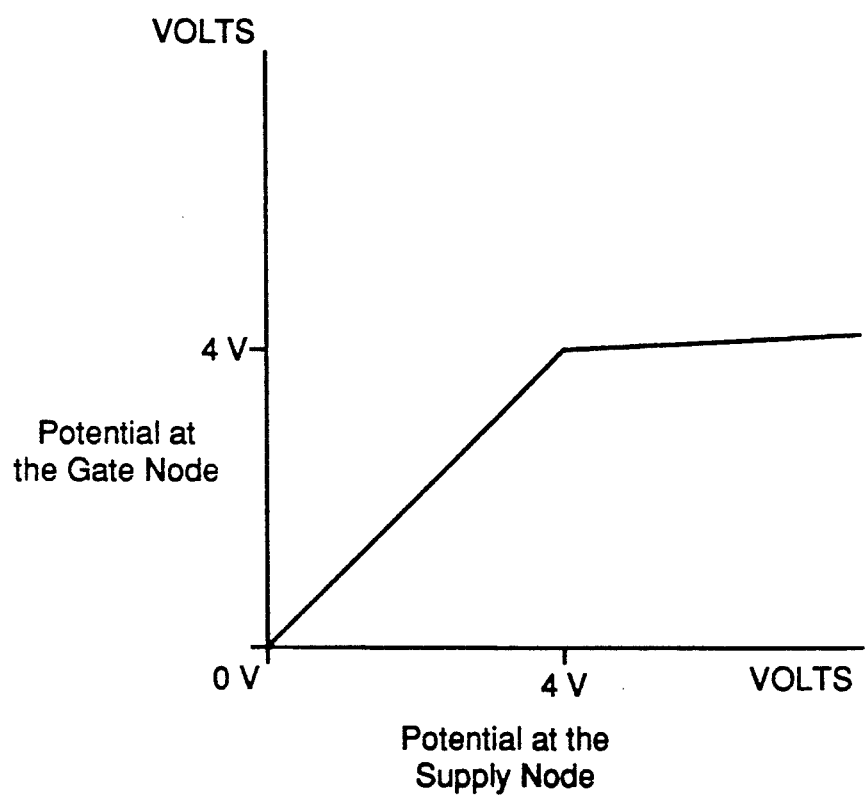
FIG. 6 is a graph relating the potential at the supply node to the potential at the gate of the n-channel metal oxide semiconductor (NMOS) transistor in the pull-up portion of FIG. 4.

Programmable circuits are well known in the art and the actual circuit implementation is not critical. The following example, shown in FIG. 5, is exemplary of a possible circuit implementation. FIG. 6 is a graphical simplification depicting the relationship between the potential of the gate node 136 and the potential of the supply node 143 for the programmable circuit 150 of FIG. 5. The programmable circuit 150 comprises a continually gated PMOS transistor 155 serially connected at the gate node 136 to five serially connected NMOS transistors. The five NMOS transistors are configured as diodes 160 by connecting the gate of each transistor to its respective drain. For this example assume each transistor has a barrier potential of 0.8 volts, therefore the total barrier potential that must be overcome to conduct current between the gate node 136 of the NMOS transistor 125 and the reference node 165 of the programmable circuit is 4 volts. Therefore when the supply potential at supply node 143 reaches approximately 4 volts the 5 diodes are capable of conducting current and the potential at the gate node is equal to 4 volts. Even though the supply potential increases the gate potential will be held at 4 volts due to the diodes 160. Up until the diodes 160 are capable of conducting current the programmable circuit behaves as a voltage follower circuit wherein the potential at the gate is directly proportional to the supply potential since the gate is pulled toward the supply potential through the continually gated PMOS transistor 155.

Therefore the programmable circuit allows the output potential to be directly proportional to the supply potential of the programmable circuit or directly proportional to the supply potential of the driver push-pull configuration when the two supply nodes 143 and 105 are electrically connected. By limiting the gate potential to a maximum value the programmable circuit also limits the output potential to a maximum predetermined potential. The maximum predetermined potential is typically a valid high logic level. The programmable circuit maintains the maximum predetermined potential at the output node even as the supply potential increases beyond a valid high logic level.

The above example is only one type of programmable circuit that may be used. Another option could allow the gate potential at gate node 136 to follow the supply potential of the regulator circuit and then utilize a potential generator to provide a pumped potential thereby limiting the potential of the gate node 136 to a maximum value equal to the pumped potential.

Figure 7A:
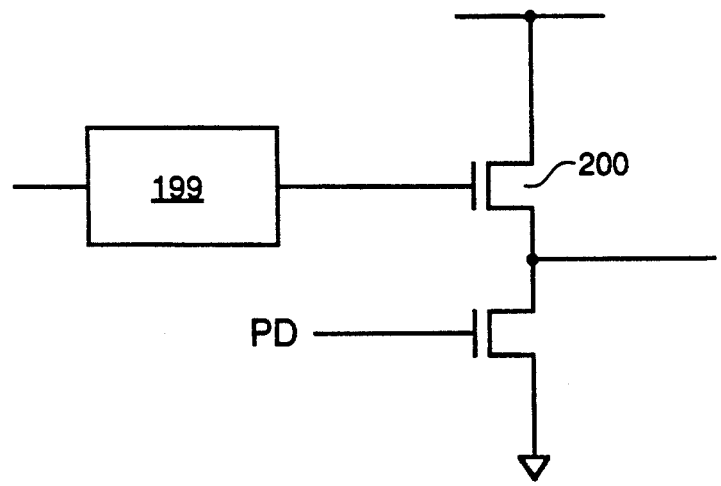
FIGS. 7A and 7B are alternate embodiments of the circuit of FIG. 5.
Figure 7B:
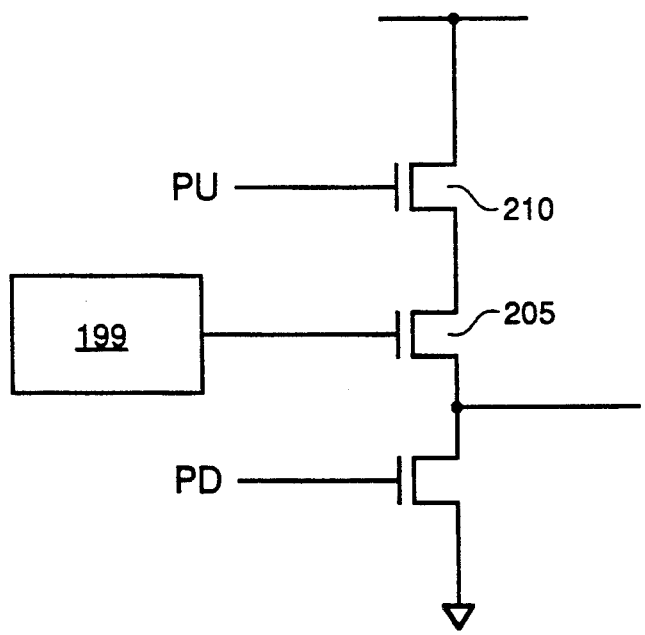

FIGS. 7A and 7B depict some examples of possible alternate embodiments of the output driver circuit using a programmable circuit 199. The pull-up portion of the circuit may incorporate just the NMOS transistor 200 as shown in FIG. 7A or two serially connected NMOS transistors 205 and 210 as shown in FIG. 7B 205 and 210. In the case of FIG. 7A where only one NMOS transistor 200 is implemented in the pull-up portion, the NMOS transistor 200 is responsive to a pull-up signal in order to drive the required data to the output node. In the alternate case wherein the two transistors 205 and 210 form the pull-up portion either or both may be responsive to the pull-up signal. Other variations and modifications may be made to the pull up portion of the circuit by those skilled in the art without departing from the spirit and scope of the invention.

Thus, it is apparent that there has been provided, in accordance with the invention, an improved output driver circuit which fully meets the objects and advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit and scope of the invention.

What is claimed is:

1. A driver circuit, comprising:
   a) a supply node connectable to a supply potential;
   b) a first driving device;
   c) a second driving device serially connected to said first driving device;
   d) an output node, said first and second driving devices interposed between said supply node and said output node; and
   e) a potential generator for providing a substantially stable pumped potential at a control input of said second driving device, said pumped potential regulated to control an output potential at said output node when said second driving device is actuated in conjunction with said first driving device being actuated, said pumped potential having a value necessary to actuate said second driving device and drive said output node to said output potential.

2. The driver circuit as specified in claim 1, wherein said output potential is dependent upon said control potential, said supply potential, and a threshold voltage of said second driving device.

3. The driver circuit as specified in claim 1, wherein said output potential lies within a desired supply logic range of potentials, said supply logic range defined by a minimum and a maximum potential.

4. The driver circuit as specified in claim 1, wherein said control potential is clocked to said control input of said second driving device thereby effecting an intermittent actuation of said second driving device, said control potential clocked to said control input in order to coincide with said first driving device being actuated.

5. The driver circuit as specified in claim 1, wherein said output potential lies within a desired supply logic range of potentials, said supply logic range defined by a minimum and a maximum potential.

6. The driver circuit as specified in claim 1, further comprising a pull-up input node for accepting a pull-up input signal for actuating and deactuating said first driving device, said pull-up input signal thereby allowing the conduction of current between said supply node and said output node when said first driving device is actuated in conjunction with said second driving device being actuated, a deactuation of said first driving device capable of interrupting a current flow between said output node and said supply node.

7. The driver circuit as specified in claim 1, further comprising:
   a) a reference node connectable to a reference potential; and
   b) a pull-down circuit for driving said output node to a potential lying within a reference logic range of potentials defined by a minimum and a maximum potential, said pull-down circuit electrically interposed between said output node and said reference node, said pull-down circuit having a pull-down input node for accepting a control signal for actuating and deactuating said pull-down circuit, said pull-down circuit when actuated driving a potential on said output node to a potential within said reference logic range, a deactuating of said pull-down circuit capable of interrupting a current flow between said reference node and said output node.

8. A driver circuit, comprising:
   a) a supply node connectable to a circuit supply potential;
   b) a first driving device;
   c) a second driving device serially connected to said first driving device;
   d) an output node, said first and said second driving devices interposed between said supply node and said output node; and
   e) a programmable circuit for adjusting a control potential at a control input of said second driving device when said second driving device is actuated in conjunction with said first driving device being actuated, said programmable circuit maintaining a linear relationship between a supply potential of said programmable circuit and said control potential such that changes in said control potential are directly proportional to changes in said supply potential of said programmable circuit.

9. The driver circuit as specified in claim 8, wherein said programmable circuit limits said control potential to provide a maximum value of said control potential.

10. The driver circuit as specified in claim 9, wherein said programmable circuit is a pumping circuit, and wherein said maximum value of said control potential is a pumped potential provided by said pumping circuit.

11. The driver circuit as specified in claim 8, wherein said programmable circuit further comprises a voltage follower circuit which automatically adjusts said control potential to follow changes in said supply potential of said programmable circuit.

12. The driver circuit as specified in claim 8, wherein said supply potential of said programmable circuit is said circuit supply potential.

13. The driver circuit as specified in claim 8, wherein said programmable circuit eliminates said linear relationship and said directly proportional changes in said control potential when said control potential reaches a maximum value, said control potential remaining at said maximum value for further increases in said supply potential.

14. The driver circuit as specified in claim 8, wherein said programmable circuit continuously applies said control potential at said control input thereby effecting a continuous actuation of said second driving device.

15. A driver circuit, comprising:
   a) a supply node connectable to a supply potential;
   b) a first driving device;
   c) a second driving device serially connected to said first driving device;
   d) an output node, said first and said second driving devices interposed between said supply node and said output node; and
   e) a regulator circuit for providing a control potential at a control input of said second driving device, said control potential regulated to control an output potential at said output node when said second driving device is actuated in conjunction with said first driving device being actuated, said control potential being less than or equal to the sum of said supply potential, said minimal threshold voltage required to actuate said second driving device, and a barrier potential of an active area of said first driving device.

16. The driver circuit as specified in claim 15, wherein said barrier potential is a barrier potential of a diode created between a p+ region and a n− well region of said PMOS transistor.

17. A method of driving a potential to an output node comprising the following steps:
   a) connecting a supply potential to a supply node;
   b) actuating a first driving device;
   c) adjusting a value of a control potential at a control node of a second driving device to control an output potential at said output node with respect to said supply potential and to limit said control potential to a maximum value; and
   d) actuating said second driving device with said control potential in order to produce a current between said output node and said supply node through said first and said second driving devices thereby effecting said output potential.

18. The method as specified in claim 17, wherein said adjusting further comprises adjusting said control potential with respect to changes in said supply potential.

19. The method as specified in claim 17, wherein said adjusting further comprises adjusting said control potential such that a value of said control potential is directly proportional to a value of said supply potential.

20. The method as specified in claim 17, wherein said adjusting further comprises adjusting said control potential such that a value of said control potential is directly proportional to a value of said supply potential of said circuit implementing said adjusting.

21. The method as specified in claim 17, further comprising actuating said second driving device with said control potential having a value less than or equal to the sum of said supply potential, a minimal threshold voltage required to actuate said first driving device, and a barrier potential of an active area of said second driving device.

22. A method of driving a potential to an output node comprising the following steps:
   a) connecting a supply potential to a supply node;
   b) actuating a first driving device;
   c) regulating a control potential at a control node of a second driving device to control an output potential at said output node;
   d) applying said control potential to said control node substantially continuously; and
   e) actuating said second driving device with said control potential in order to produce a current between said output node and said supply node through said first and said second driving devices thereby effecting said output potential.

23. The method as specified in claim 22, wherein said regulating further comprises pumping said control node to a substantially stable potential.

24. A method of driving a potential to an output node comprising the following steps:
a) connecting a supply potential to a supply node;
b) actuating a first driving device;
c) programmably adjusting a value of a control potential at a control node of a second driving device to control an output potential at said output node with respect to said supply potential and to maintain a linear relationship between the supply potential and said control potential such that changes in said control potential are directly proportional to changes in said supply potential; and
d) actuating said second driving device with said control potential in order to produce a current between said output node and said supply node through said first and said second driving devices thereby effecting said output potential.

* * * * *